United States Patent [19]

Williams

[11] Patent Number: 4,525,016
[45] Date of Patent: Jun. 25, 1985

[54] LOCKING APPARATUS FOR TEST PROBE

[76] Inventor: Robert A. Williams, 2721 White Settlement Rd., Fort Worth, Tex. 76107

[21] Appl. No.: 581,610

[22] Filed: Feb. 21, 1984

[51] Int. Cl.³ .......................................... H01R 13/631
[52] U.S. Cl. ................... 339/75 R; 339/75 M
[58] Field of Search ............... 339/75 R, 75 M, 91 R, 339/91 B; 285/82, 84, 85, 86, 314, 315, 316

[56] References Cited

U.S. PATENT DOCUMENTS

| Re. 28,328 | 2/1975 | Williams | 339/91 R |
| 3,224,800 | 12/1965 | Fisher | 285/315 |
| 3,505,635 | 4/1970 | Williams | 339/177 R |

FOREIGN PATENT DOCUMENTS 2425004 12/1974 Fed. Rep. of Germany ...... 285/315

Primary Examiner—John McQuade
Attorney, Agent, or Firm—Arthur F. Zobal

[57] ABSTRACT

The test probe has a movable sleeve located around a tubular body for axial movement to forward and rearward positions to cause latches to be moved to latching and unlatching positions respectively. A tubular member is coupled to the tubular body rearward of the movable sleeve at a position such that its forward end is spaced from the rear end of the movable sleeve when it is moved to its forward position. A ring shaped member is located around the tubular body and is coupled by keys and slots to the rear end of the movable sleeve for axial movement therewith. The keys and slots allow the ring shaped member to be moved transversely to the axis of the tubular body to locking and unlocking positions. The ring shaped member may be moved to its locking position when the movable sleeve is in its forward position to lock the movable sleeve in this position. The ring shaped member may be moved to its unlocking position to allow the movable sleeve to be moved to its forward and rearward positions.

4 Claims, 28 Drawing Figures

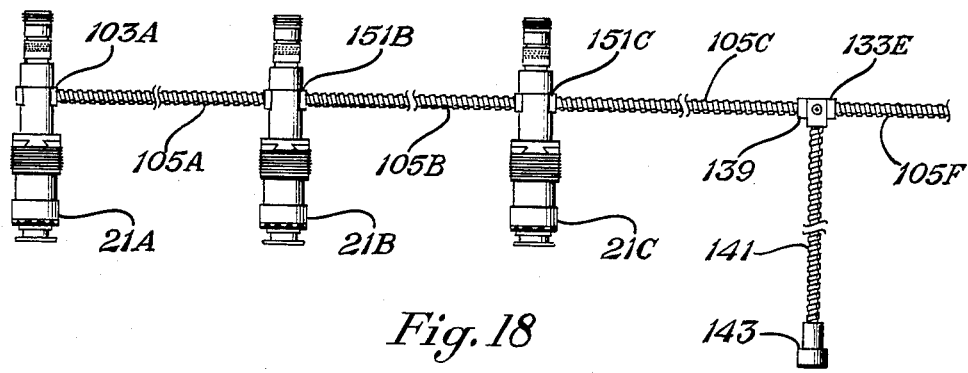
Fig. 18
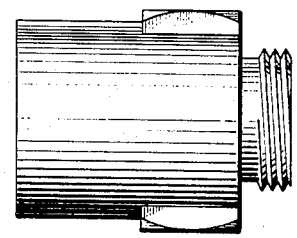
Fig. 20
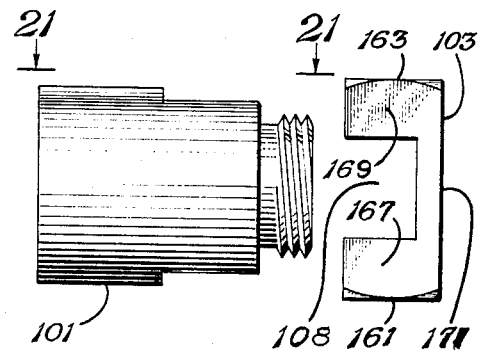
Fig. 19
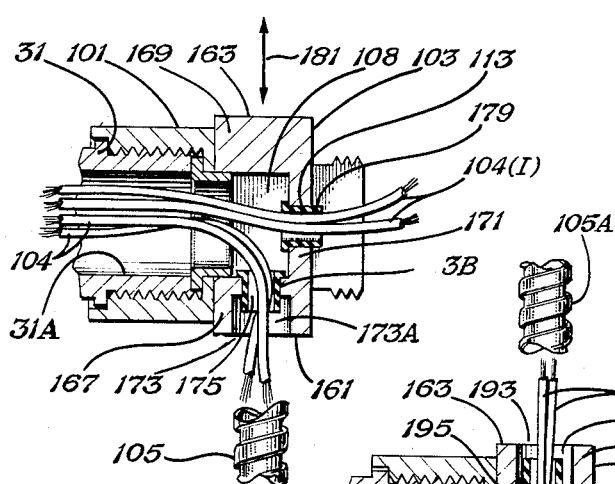
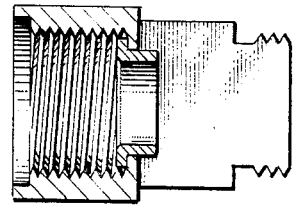
Fig. 21
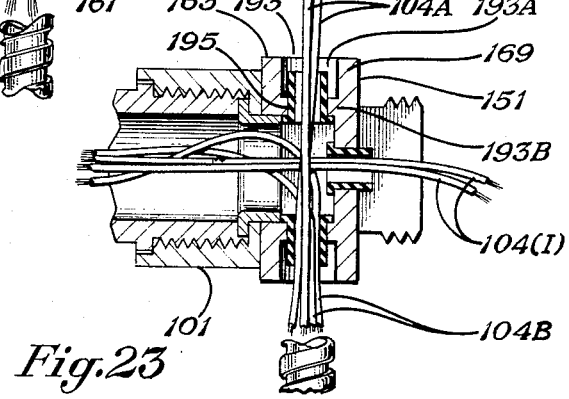
Fig. 22
Fig. 23

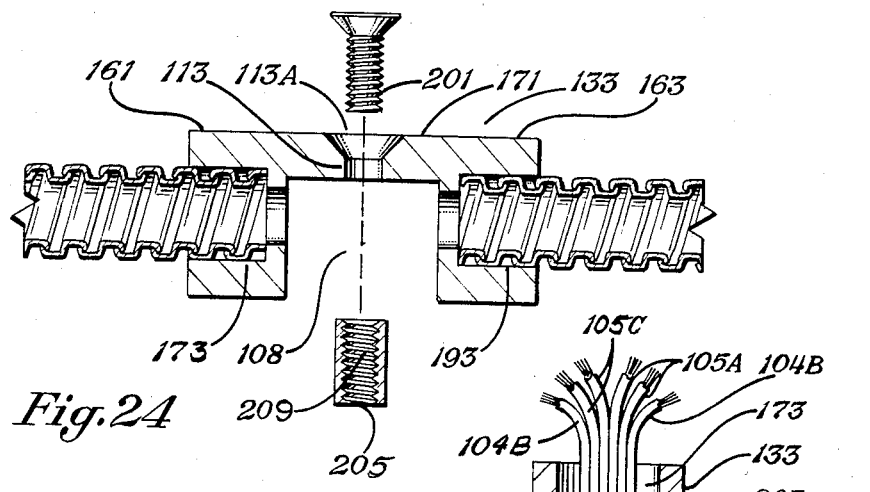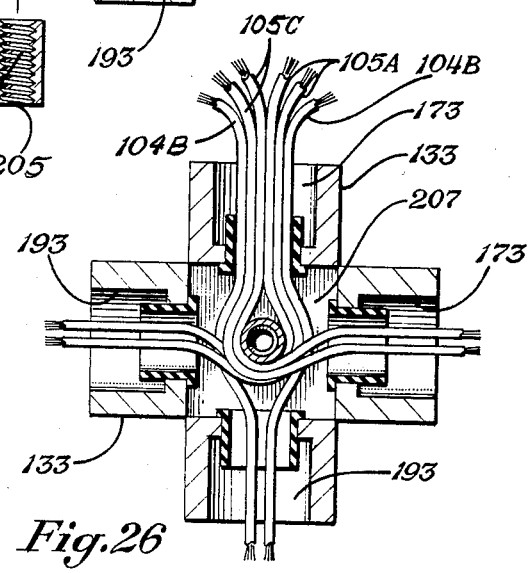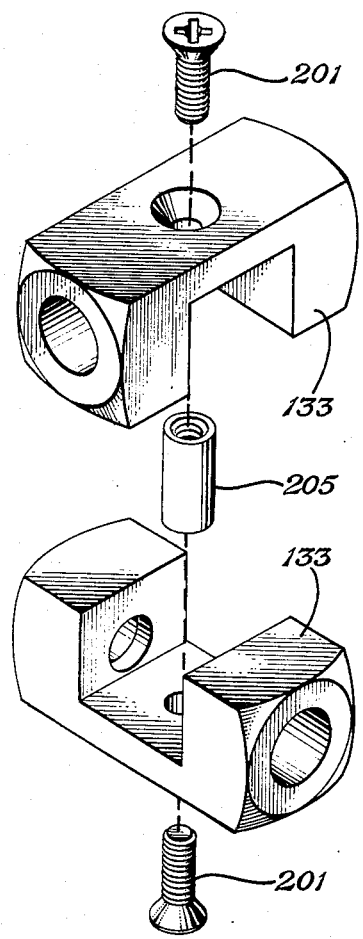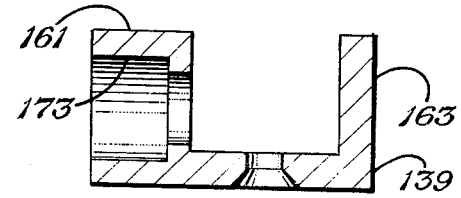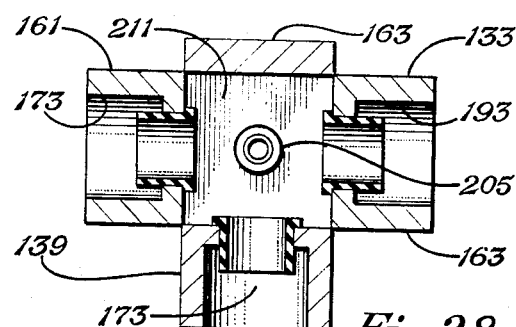
Fig.24
Fig.25
Fig.26
Fig.27
Fig.28

LOCKING APPARATUS FOR TEST PROBE

BACKGROUND OF THE INVENTION

U.S. Pat. Nos. 3,505,6 and Re 28,328 disclose test probes of the type having a pair of electrical contacts at its forward end, a central body member, and a movable sleeve located around the central body member. The sleeve is movable axially to forward and rearward positions relative to the central body member to cause latch means to be moved to latching and unlatching positions. The purpose of the latch means is to latch the probe inside of a breech cap while testing is being carried out. Problems sometimes occur, however, in that the sleeve may be accidently moved to its rearward position resulting in the probe being removed from the breech cap.

SUMMARY OF THE INVENTION

It is an object of the invention to provide a locking apparatus for a test probe of the type disclosed in U.S. Pat. Nos. 3,505,635 and Re 28,328 for locking its movable sleeve in its forward position while testing is being carried out.

Structural means is coupled to said central body member rearward of the movable sleeve at a position such that the forward end of said structural means is spaced from the rear end of said movable sleeve when it is in its forward position. A ring shaped member is located around said central body member. Coupling means is provided for coupling said ring shaped member to the rear end of said movable sleeve such that said movable sleeve will move axially with said movable sleeve when said movable sleeve is moved to its forward and rearward positions. Said coupling means allows said ring shaped member to be moved to locking and unlocking positions in directions transverse to the axis of said central body member. Said ring shaped member is movable to its locking position when said movable sleeve is in its forward position thereby locating a portion of said ring shaped member between a portion of said rear end of said movable sleeve and a portion of the forward end of said structural means to prevent said movable sleeve from being moved to its rearward position. When said ring shaped member is in its unlocked position, its opening is located to allow said movable sleeve to be moved to its forward and rearward positions. Said ring shaped member is located at least partially around the forward end of said structural means when said movable sleeve is located at its rear position.

BRIEF DESCRIPTION OF THE DRAWINGS

In FIG. 1, the movable sleeve of the test probe is in its forward position.

In FIG. 2, the locking ring is in its unlocked position.

In FIG. 5, the electrical components and the latching mechanism are not shown.

In FIG. 6, the movable sleeve is in its forward position and the locking ring is in its unlocked position.

FIG. 18 is a partial assembly of test probes connected together in another manner by armored cables.

FIG. 19 is an exploded view of one of the fittings of the invention and a sleeve of a test probe to which the fitting is to be connected.

FIG. 20 is a side view of the sleeve of FIG. 19 with the fitting located in the slot of the sleeve.

FIG. 21 is a cross section of the sleeve of FIG. 19 taken along the lines 21—21 thereof.

FIG. 22 is a cross sectional view of the sleeve and fitting of FIG. 19 with the fitting located in the slot of the sleeve and with the sleeve coupled to the rear end of the tubular body of FIG. 5. In FIG. 22, electrical leads also are shown.

FIG. 23 is a view similar to that of FIG. 22 but with a fitting of a different embodiment located in the slot of the sleeve.

FIG. 24 is a cross sectional view of a fitting of the invention with the ends of armored cables connected to the opposite ends of the fitting.

FIG. 25 is an exploded view of two fittings of the invention to be secured together transverse to each other.

FIG. 26 is a cross sectional view of two fittings of the invention secured together transverse to each other and illustrating electrical leads extending through the apertures and slots of the sleeves.

FIG. 27 is a cross sectional view of another embodiment of a fitting of the invention.

FIG. 28 is a cross sectional view of a fitting of FIG. 27 and a fitting of FIG. 26 secured together transverse to each other.

DESCRIPTION OF THE PREFERRED EMBODIMENTS

Figure 1:
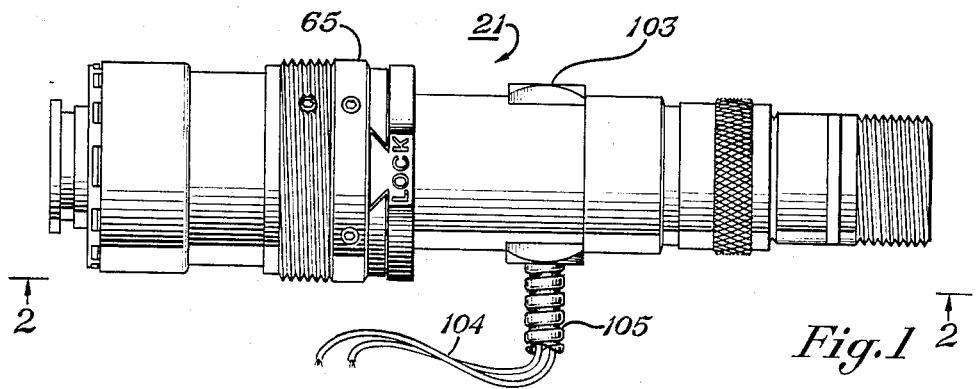
FIG. 1 is a side view of a test probe incorporating the locking apparatus of the invention.
Figure 2:
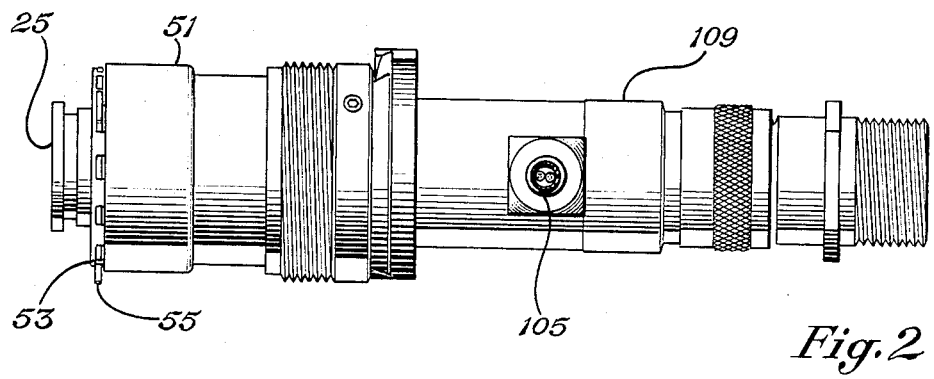
FIG. 2 is a side view of the test probe of FIG. 1 as seen from lines 2—2 of FIG. 1.
Figure 3:
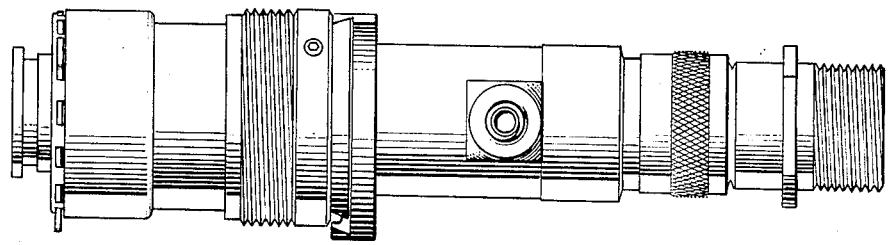
FIG. 3 is a side view similar to that of FIG. 2 of the test probe but with its locking ring in its locked position.
Figure 4:
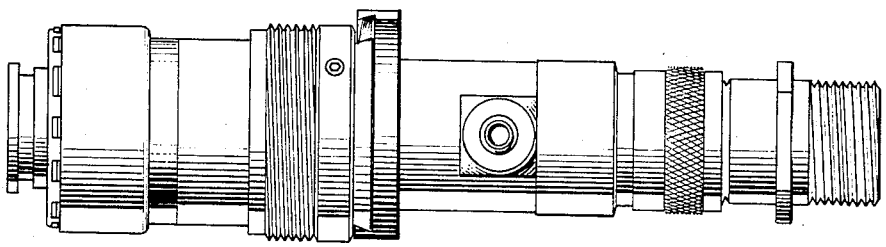
FIG. 4 is a side view of the test probe of FIG. 1 with its locking ring in its unlocked position and its movable sleeve in its rearward position.
Figure 5:
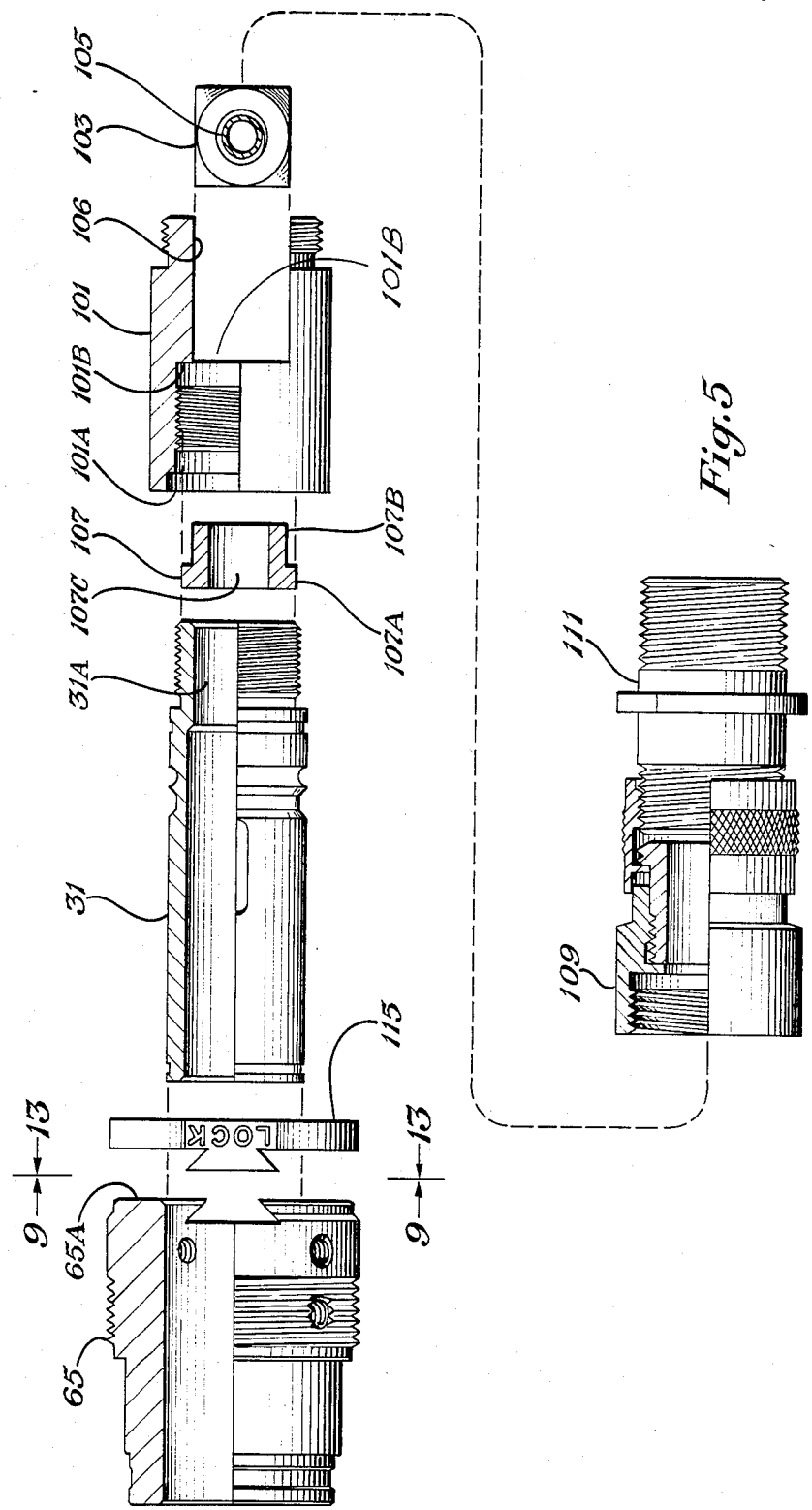
FIG. 5 is an exploded view of a portion of the structural components of the test probe.

Referring now to FIGS. 1-15 of the drawings, a test probe and the locking mechanism of the invention will be described. The test probe is identified at 21. It comprises a central tubular body or member 31 and an axially movable sleeve 65 located around the tubular body 31. The tubular body 31 is round in cross section. Sleeve 65 is a tubular sleeve also round in cross-section. The sleeve 65 may be moved axially to forward and rearward positions relative to the tubular body 31. An annular shell 51 is coupled to the forward end of the tubular body 31. The annular shell 51 has openings 53 through which latch elements 55 may be moved radially outward and inward when the sleeve 65 is moved axially forward and rearward respectively. A spring biased axially located electrical contact and a spring biased annular electrical contact extend forward through a central opening formed through the front end of the annular shell 51. The annular electrical contact surrounds and is spaced from the axially located electrical contact. In FIGS. 1-4 the annular electrical contact is shown at 25. Reference is made to U.S. Pat. No. Re 28,328 for a detailed description of the electrical contacts and one embodiment of an arrangement for moving the latches 55 radially outward and inward upon movement of the sleeve 65 to its forward and rearward positions. U.S. Pat. No. Re 28,328 is hereby incorporated into this application by reference. It is to be understood that the latches also may be of the type disclosed in U.S. Pat. No. 3,505,635 and this patent is hereby incorporated into this application by reference.

A tubular mounting member 101, round in cross section, is screwed to the rear end of the tubular body 31. The member 101 holds a block member 103 to which a flexible armored cable 105 is attached for providing a conduit for electrical leads for connection to the forward electrical contacts. In FIG. 1, the electrical leads of cable 105 are shown at 104. The block member 103 is located in a slot 106 formed through the rear of the member 101 and is held in place by a bushing 107 extending into a slot 108 of the member 103 and by another tubular member 109 screwed to the rear end of the member 101. A rear tubular member 111 is screwed to the rear of the member 109. A rear opening 113 formed through the member 103 provides a passageway for electrical leads extending to a connector for connection to test equipment.

Figure 6:
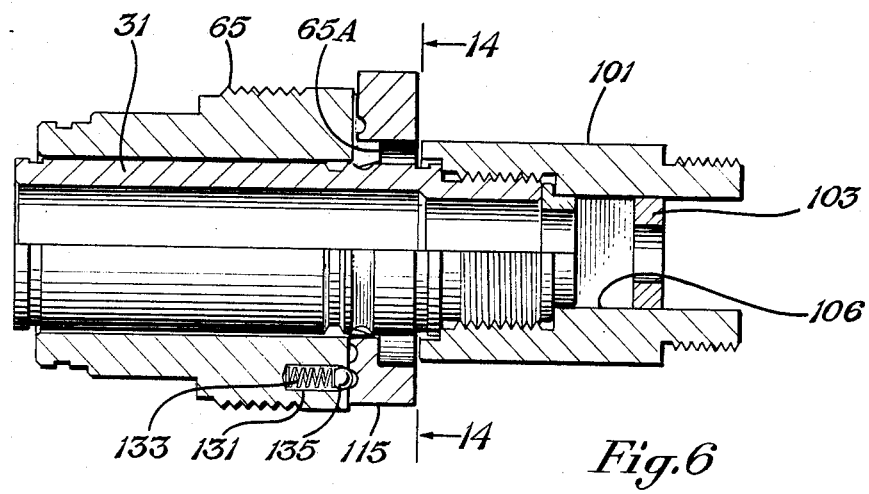
FIG. 6 is a partial cross sectional view of a portion of the components of FIG. 5 in their assembled position.
Figure 7:
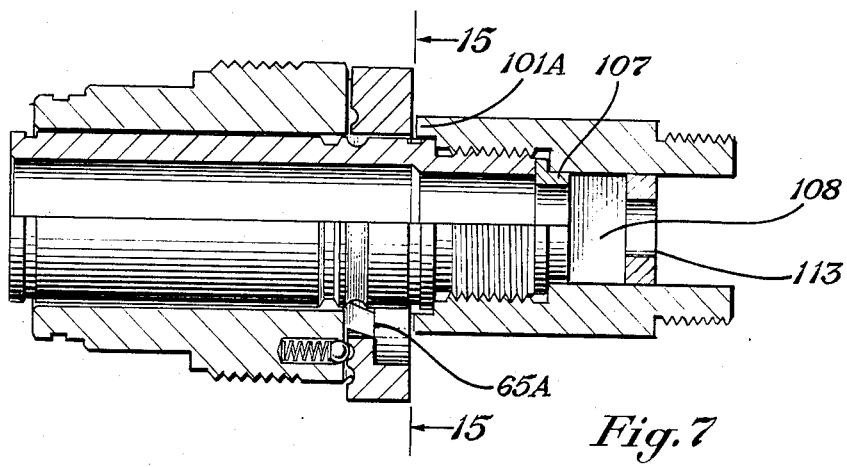
FIG. 7 is a partial cross sectional view similar to that of FIG. 6 with the movable sleeve of the test probe in its forward position but with and its locking ring in its locked position.
Figure 15:
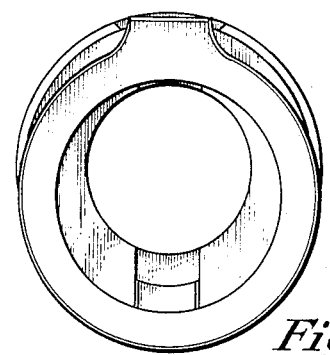
FIG. 15 is a view of FIG. 7 taken along the lines 15—15 showing the locking ring in its locked position relative to the movable sleeve with the central tubular body removed.

As shown in FIGS. 6 and 7, the forward end 101A of the member 101 is spaced from the rear end 65A of the sleeve 65 when the sleeve 65 is in its forward position. Located around the tubular body 31 and coupled to the rear end of the sleeve 65 is a ring shaped member 115. Referring to FIGS. 9 and 11-15 radially extending slots 117 and 119 are formed in the rear end 65A of the sleeve 65 on opposite sides of its central opening 121. Radially extending keys 123 and 125 are formed on the forward end of the ring shaped member 115 on opposite sides of its central opening 127. The cross sectional shape of the keys 123 and 125 correspond to the shapes of the slots 117 and 119 respectively and the keys 123 and 125 are located in slots 117 and 119 respectively for sliding movement therein. The keys and slots couple the ring shaped member 115 to the rear of the sleeve 65 such that the ring shaped member will move axially with the sleeve 65 when it is moved to its forward and rearward positions. The keys and slots also allow the ring shaped member 115 to be moved to locking and unlocking positions in directions transverse or perpendicular to the central axis of the sleeve 65 and the tubular body 31. The ring shaped member 115 is movable to its locking position only when the sleeve 65 is in its forward position. As seen in FIGS. 7 and 15, when the ring shaped member 115 is moved to its locking position, the upper portion of the member 115 is moved between the upper portion of the rear end of the sleeve 65 and the upper portion of the forward end of the member 101 thereby blocking and preventing the sleeve 65 from being moved to its rearward position. When the ring shaped member 115 is moved to its unlocked position, its opening 127 is located in a position to allow the sleeve 65 to be moved to its forward and rear positions. As seen in FIGS. 6-9, key 125 has two arcuate shaped slots 125A and 125B formed in its forward end. A cylindrical shaped aperture 131 formed in the lower end of the rear end 65A of the sleeve 65 has a small compression spring 133 for urging a small ball 135 into either the slot 125A or the 125B when the ring shaped member 115 is moved to either its locking or unlocking positions. The purpose of the spring 131 and ball 133 and the slots 125A and 125B is to hold the ring shaped member 115 in either of its locking or unlocking positions yet to allow the ring shaped member 115 to be moved to its other position by finger action. Thus the spring 131, ball 133 and slots 125A and 125B provide means for releasably holding the ring shaped member 115 in either its locking or unlocking positions.

Figure 8:
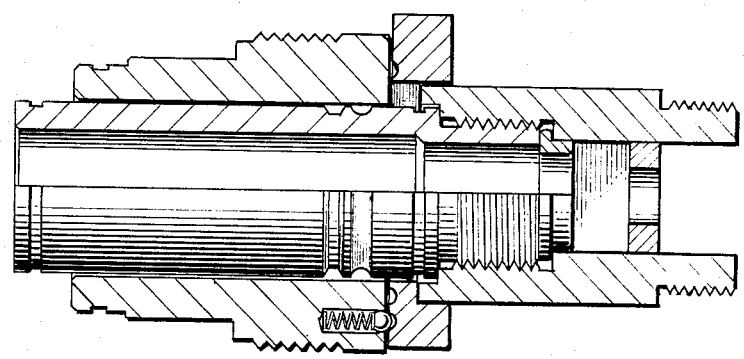
FIG. 8 is a partial cross sectional view similar to that of FIG. 6 but with the locking ring in its unlocked position and with the movable sleeve of the test probe in its rearward position.
Figure 9:
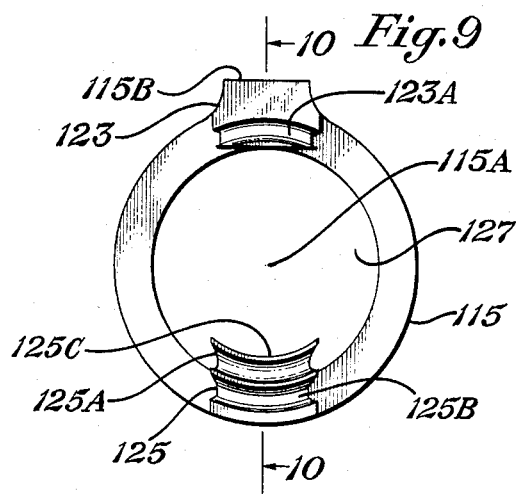
FIG. 9 is a view of the forward end of the locking ring as seen from lines 9—9 of FIG. 5.
Figure 10:
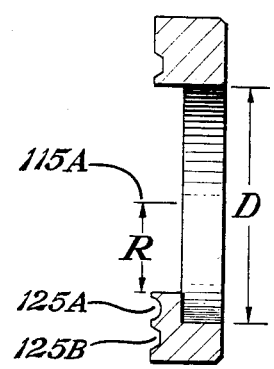
FIG. 10 is a cross sectional view of FIG. 9 taken along the lines 10—10 thereof.
Figure 11:
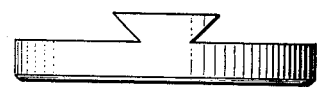
FIG. 11 is a view of one edge of the ring of FIG. 9.
Figure 12:
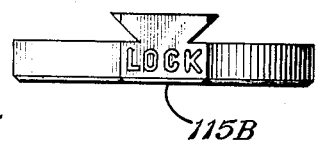
FIG. 12 is a view of the opposite edge of the ring of FIG. 9.
Figure 13:
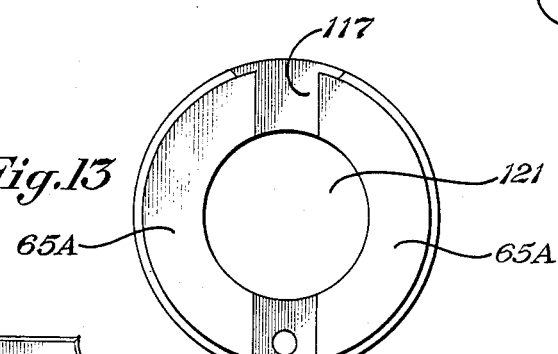
FIG. 13 is a rear end view of the movable sleeve of the test probe as seen along the lines 13—13 of FIG. 5.
Figure 14:
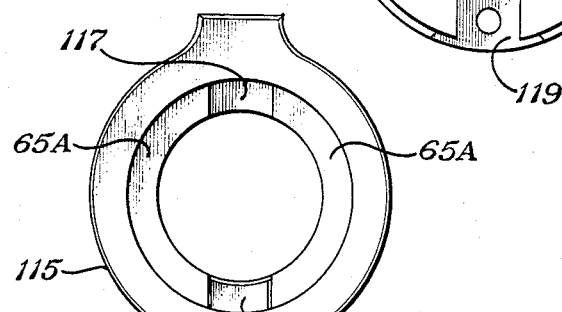
FIG. 14 is a view of FIG. 6 taken along the lines 14—14 showing the locking ring in its unlocked position relative to the movable sleeve with the central tubular body removed.

The radius R of the inner surface 125C of the key 125 relative to the central axis 115A of the ring shaped member 115 is greater than the maximum outer radius of the tubular member 31. The inside diameter D of the ring shaped member 115 is greater than the maximum outside diameter of the member 101. When ring shaped member 115 is in its unlocking position and the sleeve 65 is moved to its rearward position, the ring shaped member 115 is located around the forward portion of the member 101 as shown in FIG. 8. In the rearward position of the sleeve 65, its rear end 65A abuts against the forward end 101A of the member 101.

The purpose of the word "Lock" on the edge 115B of the ring shaped member 115 is to enable the user to know that the member 115 can be locked by pushing against the edge 115B when the sleeve 65 is in its forward position.

The slot 123A in key 123 serves no useful purpose. It is formed during the process of cutting the slot 125B and is not removed.

Referring also to FIGS. 16-29, there will described the fittings and their cables and the manner in which the fittings are secured to each other and to the test probes which are claimed in my copending U.S. patent application Ser. No. 06/581,608, entitled "Armored Cables and Fittings For Test Probes," filed the same date as the present U.S. patent application. The armored cables are commercially available. They are formed of spirally wound metal strips forming flexible and hollow high strength cables which are used in the invention to provide strong and durable conduits for electrical leads for connection to the test probes. In FIGS. 1-5, one of the armored cables is identified at 105. It is connected to a fitting 103 which in turn is secured to the test probe 21.

Figure 16:
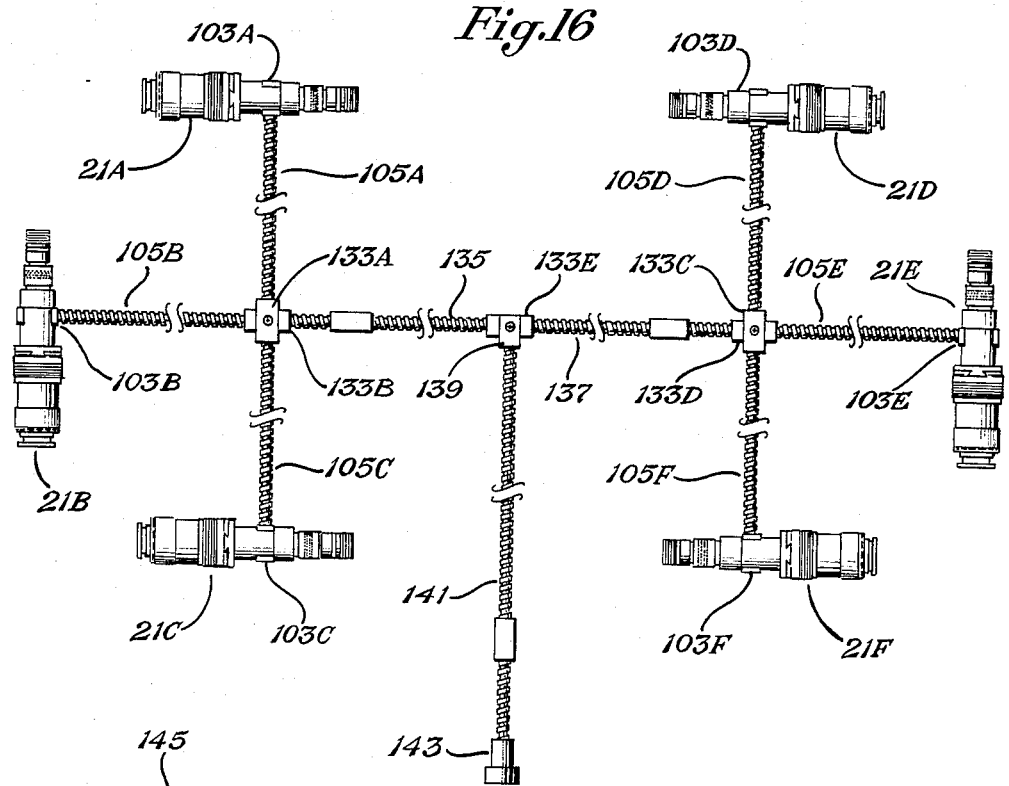
FIG. 16 is an assembly of test probes connected together by armored cables.

In FIG. 16, an assembly of the test probes 21A-21F connected to their armored cables 105A-105F is shown. Each of the probes 21A-21F is essentially the same. The ends of the cables 105A-105F are connected to the ends of fittings 103A–103F respectively which in turn are secured to the probes 21A–21F. Each of the fittings 103A–103F is the same as the fitting 103 shown in FIG. 22. The other ends of the cables 105A–105F are connected to the ends of fittings 133A–133D as shown in FIG. 16. Fittings 133A and 133B are coupled together and fittings 133C and 133D are coupled together. Each of the fittings 133A–133D is the same as fitting 133 shown in FIGS. 24–26. The ends of armored cables 135 and 137 are connected to the ends of fittings 133B and 133D and to the ends of fitting 133E. Fitting 133E is the same as fitting 133 and is coupled to a fitting 139 which is of the type shown at 139 in FIGS. 27 and 28. An armored cable 141 has one end connected to fitting 139 and its other end connected to a connector 143.

Figure 17:
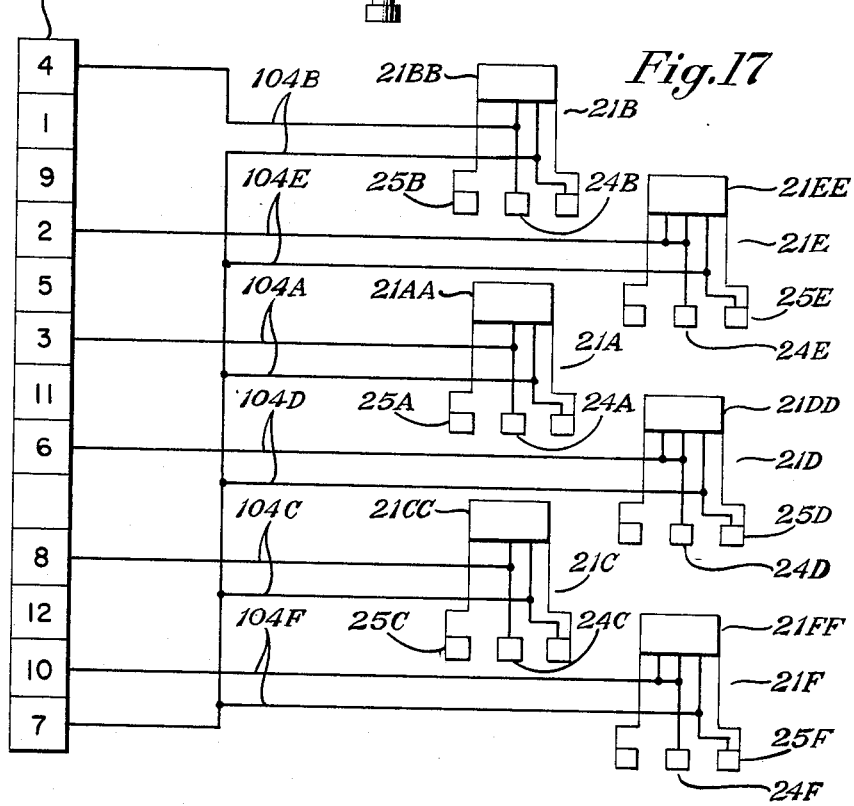
FIG. 17 is an electrical wiring diagram of the assembly of test probes of FIG. 16.

The wiring diagram of the assembly of test probes of FIG. 16 is shown in FIG. 17. The center contacts of the probes 21A–21F are shown at 24A–24F respectively and the outer annular contacts of the probes are shown at 25A–25F respectively. Members 21AA–21FF are rear connectors of the probes 21A–21F to which the forward contacts 24A–24F and 25A–25F are connected. The rear connectors are located in tubular member 111 of the probes and are connectible to test equipment. The pairs of electrical leads of the probes are shown at 104A–104F. They are coupled to the contacts of their probes and to pins indicated at 145 of the connector 143. The six pairs of leads 104A–104F extend from the connector 143 through the cable 141 to the fittings 133E and 139. From the fittings 133E and 139, three pairs of leads 104A–104C branch off and extend through cable 135 and the other three pairs of leads 104B–104F branch off and extend through the cable 137. From the fittings 133A and 133B, leads 104A–104C branch off and extend through their cables 105A–105C to their probes 21A–21C respectively. From the fittings 133C and 133D, leads 104D–104F branch off and extend through cables 105D–105F to their probes 21D–21F.

Referring now to FIG. 18, the test probe assembly comprises the six test probes 21A–21E of FIG. 16, however, only three of the test probes 21A–21C are shown. The difference in the assembly of FIG. 18 from that of FIG. 16 is the manner in which the test probes are connected to the cables and the manner in which the electrical leads extend through the cables and some of the test probes. Test probe 21A, its fitting 103A and its cable 105A is the same as that of FIG. 16, however, in the assembly of FIG. 18, the other end of the cable 105A is connected to an end of a fitting 151B of test probe 21B. The cable 105B is connected to the other end of the fitting 151B and then to the end of a fitting 151C of test probe 21C. The cable 105C is connected to the other end of fitting 151C and then to the fitting 139. The other three test probes 21D–21E are connected in a similar manner. The fittings 151B and 151C are the same as fitting 151 shown in FIG. 23. The six pair of electrical leads 104A–104F extend from the connector 143 through the cable 141 to the fittings 133E and 139. From the fittings 133E and 139, three pairs of leads 104A–104C branch off and extend through cable 105C and the other three pairs of leads 104D–104F branch off and extend through the cable 105F. Leads 104C are connected to the test probe 21C. The other two pair of leads 104B and 104A extend through the fitting 151C and through cable 105B to the fitting 151B. The leads 104B are connected to the test probe 21B and the other pair of leads 104A extend through the fitting 151B and through the cable 105A and are connected to the test probe 21A. The three pairs of leads 104D–104F extend to their probes 21D–21F in a similar manner.

Referring to FIGS. 5 and 19–22, there will be described in more detail one of the fittings 103 and the manner in which the fitting is secured to a test probe. The fitting 103 is formed of metal. It has two opposite ends 161 and 163 and a slot 108 formed through the fitting between its two ends defining two spaced apart structural portions 167 and 169 extending from the same side of a base portion 171. An aperture 173 extends through the structural portion 167 between its end 161 and the slot 108. The aperture 173 comprises an enlarged portion 173A and a smaller portion 173B. One end of the cable 105 is inserted into the enlarged portion 173A of the aperture 173 and bonded therein for example by brazing. An electrically insulating tubular member 175 extends through the smaller aperture portion 173B. The aperture 113 is formed through the base portion 171 and has an electrically insulating tubular member 179 located therein. In assembling the fitting 103 to the member 101, the fitting is located in the slot 106 of the member 101 such that the slot 108 of the fitting 103 is in communication with the central opening 101B of the member 101 and hence in communication with the central opening 31A of the tubular body 31. The bushing 107 has an enlarged diameter portion 107A and a smaller diameter portion 107B with an opening 107C extending therethrough between the enlarged portion and the smaller portion. The bushing 107 is located within the central opening 101A of the member 101 until its enlarged portion 107 abuts against a shoulder 101B of the member 101. In this position, the smaller diameter portion 107B extends into the slot 106 of the member and within the slot 108 of the fitting 103 preventing the fitting 103 from being removed from the slot 106 by movement in either of the directions indicated by the arrows 181 in FIG. 22. The electrical leads 104 extending through the cable 105 extend through the aperture 173 and insulating tube 175 of the fitting 103 and through the central opening 101A of the member 101 and the central opening 31A of the tubular body 31 to the contacts 24A and 25A of the probe 21. Electrical leads 104(I) are connected to the leads 104 inside the tubular body 31 and extend through the tubular member 179 and the aperture 177 to the rear connector of the probe 21. The fitting 103 is secured in place by screwing the member 109 onto the threads formed at the rear of the member 101 until the forward end of the member 109 abuts against the rear end of the fitting 103.

Referring now to FIG. 23, the fitting 151 is the same as fitting 103 except that an aperture 193 extends through the structural portion 169 between its end 163 and the slot 108. The aperture 193 comprises an enlarged portion 193A and a smaller portion 193B. One end of a cable 105 is inserted into the enlarged portion 193A of the aperture 193 and bonded therein, for example, by brazing. An electrically insulating tubular member 195 extends through the smaller aperture portion 193B. The purpose of the aperture 193 is to allow passage of other pairs of leads through the fitting 151, for example, when employed as fitting 151B of the assembly of FIG. 18. In this embodiment, leads 104A extend through the apertures 173 and 193 of the fitting 151B to the probe 21A by way of cable 105A.

Referring now to FIGS. 24–26, each of the fittings 133 is the same as fitting 151 except the aperture 113 formed through the base portion 171 is countersunk at 113A for receiving a cone shaped head of a bolt 201. The fittings 133 may be secured together transverse to each other as shown in FIGS. 25 and 26 with the use of bolts 201 and a stand off member 205 to form a chamber 207. In this connecting arrangement, the inside surfaces of the base portions 171 of two of the fittings 133 face each other and the stand off member 205 has two opposite ends which engage the central portions of the base portions 171. The stand off member 205 has a threaded aperture 209 formed therethrough. Bolts 201 then are inserted through the apertures 113 of the fittings and screwed into the opposite ends of the stand off members 205 to secure the fittings together. The chamber 207 is formed between the inner walls of the structural portions 167 and 169 and the base portions 171 of the two fittings which define their two slots 108. The chamber 207 has four openings defined by the apertures 173 and 193 of the two fittings for the passage of electrical leads. The stand off member 205 not only supports the two fittings in this manner to form the chamber 207 but it forms a guiding member for guiding the electrical leads through the chamber. For example, in FIG. 26, the three pairs of electrical leads 104A–104C are shown extending through the aperture 173 of one of the fittings 133 into the chamber 207 and then around the stand off member 207 for passage through the other three apertures of the two fittings for extension to their test probes by way of their cables. This type of fitting assembly is the same as that of FIG. 16 wherein fittings 133A and 133B are connected together and fittings 133C and 133D are connected together.

Referring to FIG. 27, the fitting 139 is the same as fitting 133 except that its structural portion 163 is relatively thin and has no aperture formed therethrough. The fitting 139 may be connected with a fitting 133 with a stand off member 205 and two bolts 201 in the same manner as two fittings 133 are connected together as shown in FIGS. 25 and 26 to form a chamber 211 having only three openings for the passage of electrical leads. Two of the fittings 133 and 139 may be connected together and used as the fitting assembly 133E and 139 of FIG. 16 to provide passages for all of the wires through the opening 173 of fitting 139 to the central chamber 209 where they are bent around the stand off member and divide to two different branches as described with respect to FIG. 16.

Thus as can be understood, the different types of fittings with their armored cables form high strength passageways for electrical leads. The fittings may be readily connected together to form different types of intersecting passageways for the leads and to test probes for providing passageways for the leads to the probes.

I claim:

1. Locking apparatus for a test probe of the type having electrical contact means at its forward end, a central body member, a movable sleeve located around said central body member, said movable sleeve being movable axially to forward and rearward positions relative to said central body member to cause latch means to be moved to latching and unlatching positions respectively relative to said central body member, comprising:

structural means coupled to said central body member rearward of said movable sleeve at a position such that the forward end of said structural means is spaced from the rear end of said movable sleeve when it is in its forward position, a ring shaped member located around said central body member, coupling means for coupling said ring shaped member to the rear end of said movable sleeve such that said ring shaped member will move axially with said movable sleeve when said movable sleeve is moved to its forward and rearward positions, said coupling means allowing said ring shaped member to be moved to locking and unlocking positions in directions transverse to the axis of said central body member, said ring shaped member being movable to its locking position when said movable sleeve is in its forward position thereby locating a portion of said ring shaped member between a portion of said rear end of said movable sleeve and a portion of the forward end of said structural means to prevent said movable sleeve from being moved to its rearward position, when said ring shaped member is in its unlocked position, its opening being located to allow said movable sleeve to be moved to its forward and rear positions, said ring shaped member being located at least partially around the forward end of said structural means when said movable sleeve is located at its rear position.

2. The locking apparatus of claim 1, comprising: means for releasably holding said ring shaped member in its locking and unlocking positions.

3. Locking apparatus for a test probe of the type having electrical contact means at its forward end, a tubular body, a movable sleeve located around said tubular body, said movable sleeve being movable axially to forward and rearward positions relative to said tubular body to cause latch means to be moved to latching and unlatching positions respectively relative to said tubular body, comprising:

a tubular member coupled to said tubular body rearward of said movable sleeve at a position such that the forward end of said tubular member is spaced from the rear end of said movable sleeve when it is in its forward position, a ring shaped member located around said tubular body, slots formed radially in said rear end of said movable sleeve on opposite sides of its opening, key members formed on the forward end of said ring shaped member and extending radially on opposite sides of its opening, said key members being located in said slots such that said ring shaped member will move axially with said movable sleeve when said movable sleeve is moved to its forward and rearward positions, said key members of said ring shaped member being movable in said slots such that said ring shaped member may be moved to locking and unlocking positions in directions transverse to the axis of said tubular body, said ring shaped member being movable to its locking position when said movable sleeve is in its forward position thereby locating a portion of said ring shaped member between a portion of said rear end of said movable sleeve and a portion of the forward end of said tubular member to prevent said movable sleeve from being moved to its rearward position, when said ring shaped member is in its unlocked position, its opening being located to allow said movable sleeve to be moved to its forward and rear positions, said ring shaped member being located at least partially around the forward end of said tubular member when said movable sleeve is located at its rear position.

4. The locking apparatus of claim 3, comprising:

means for releasably holding said ring shaped member in its locking and unlocking positions.

* * * * *